(12) United States Patent
Wang

(10) Patent No.: US 10,991,690 B2
(45) Date of Patent: Apr. 27, 2021

(54) SEMICONDUCTOR STRUCTURE AND METHOD FOR FORMING SAME

(71) Applicants: Semiconductor Manufacturing International (Beijing) Corporation, Beijing (CN); Semiconductor Manufacturing International (Shanghai) Corporation, Shanghai (CN)

(72) Inventor: Nan Wang, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/424,924

(22) Filed: May 29, 2019

(65) Prior Publication Data

US 2020/0035676 A1  Jan. 30, 2020

(30) Foreign Application Priority Data

Jul. 26, 2018 (CN) .......................... 201810837968.8

(51) Int. Cl.
| | | |
|---|---|---|
| H01L 27/088 | (2006.01) | |
| H01L 29/66 | (2006.01) | |
| H01L 21/02 | (2006.01) | |
| H01L 29/161 | (2006.01) | |
| H01L 21/3065 | (2006.01) | |

(Continued)

(52) U.S. Cl.
CPC .... *H01L 27/0886* (2013.01); *H01L 21/02532* (2013.01); *H01L 21/3065* (2013.01); *H01L 21/823412* (2013.01); *H01L 21/823431* (2013.01); *H01L 21/823437* (2013.01); *H01L 21/823481* (2013.01); *H01L 29/0649* (2013.01); *H01L 29/161* (2013.01);
(Continued)

(58) Field of Classification Search
CPC ............. H01L 27/0886; H01L 27/0924; H01L 29/66545; H01L 29/6681; H01L 29/785; H01L 29/78696; H01L 29/42392; H01L 29/7848; H01L 29/78642; H01L 29/66795; H01L 21/823431; H01L 21/823437; H01L 21/823412
See application file for complete search history.

(56) References Cited

U.S. PATENT DOCUMENTS 10,014,390 B1 * 7/2018 Bouche ............... H01L 29/0665
2020/0152780 A1 * 5/2020 Zhou ................. H01L 29/42392

\* cited by examiner

*Primary Examiner* — Hsien Ming Lee
(74) *Attorney, Agent, or Firm* — Brinks Gilson & Lione

(57) ABSTRACT

A semiconductor structure and a method for forming same are provided. The forming method includes: providing a substrate, a fin protruding from the substrate, and at least two channel laminates sequentially located on the fin, where each channel laminate includes a sacrificial layer and a channel layer; forming a gate structure across the channel laminates; forming, in the channel laminates, a groove that exposes the fin, where after the groove is formed, the fin, the channel layer adjacent to the fin, and the remaining sacrificial layer encircle a first trench, adjacent channel layers and the remaining sacrificial layer between the adjacent channel layers encircle a second trench; forming first spacers in the first trench and the second trench; and forming a source-drain doping layer in the groove.

20 Claims, 6 Drawing Sheets

(51) Int. Cl.
*H01L 29/78* (2006.01)
*H01L 21/8234* (2006.01)
*H01L 29/06* (2006.01)

(52) U.S. Cl.
CPC .... *H01L 29/6681* (2013.01); *H01L 29/66545* (2013.01); *H01L 29/785* (2013.01)

SEMICONDUCTOR STRUCTURE AND METHOD FOR FORMING SAME

RELATED APPLICATIONS

This present application claims priority to Chinese Patent Appln. No. 201810837968.8, filed Jul. 26, 2018, the entire disclosure of which is hereby incorporated by reference.

BACKGROUND

Technical Field

The present disclosure relates to the field of semiconductor manufacturing, and in particular, to a semiconductor structure and a method for forming same.

Related Art

In the field of semiconductor manufacturing, with the development trend of very-large-scale integrated circuits, a critical dimension of an integrated circuit becomes smaller continuously. In order to better meet the requirement of proportional reduction of a device size, the semiconductor process gradually transits from a planar transistor to a three-dimensional transistor with higher efficacy, such as a gate-all-around ("GAA") transistor with fins. In the GAA transistor, the gate surrounds a channel region from all directions. Compared with the planar transistor, the gate of the GAA transistor has a stronger channel controlling capability and can better suppress short-channel effects.

When the size of a semiconductor device is reduced to a certain degree, how to solve a high leakage current of the semiconductor device becomes the most challenging problem. The high leakage current of the semiconductor device is mainly caused by a continuous decrease in the thickness of a conventional gate dielectric layer. Therefore, the current solution is to replace a conventional silicon dioxide gate dielectric material with a high k gate dielectric material, and use a metal as a gate electrode, so as to avoid a Fermi level pinning effect and a boron penetration effect between a high k material and a conventional gate electrode material.

SUMMARY

A problem addressed by the forms of the present disclosure is to provide a semiconductor structure and a method for forming same, so as to improve device performance.

In order to address the foregoing problem, a form of the present disclosure provides a method for forming a semiconductor structure, including: providing a base, where the base includes a substrate, a fin protruding from the substrate, and at least two channel laminates sequentially located on the fin, and each channel laminate includes a sacrificial layer and a channel layer located on the sacrificial layer; forming a gate structure across the channel laminates, where the gate structure covers a part of the top and a part of sidewalls of the channel laminates; etching the channel laminates on two sides of the gate structure to form a groove that exposes the fin in the channel laminates, where after the groove is formed, a part of the channel layer is exposed on two sides of the remaining sacrificial layer below the gate structure, where the fin, the channel layer adjacent to the fin and the remaining sacrificial layer encircle a first trench, and adjacent channel layers and the remaining sacrificial layer between the channel layers encircle a second trench, where the quantity of the channel laminates is two, and along a direction perpendicular to sidewalls of the gate structure, the depth of the second trench is greater than the depth of the first trench, or the quantity of the channel laminates is greater than or equal to three, and along the direction perpendicular to the sidewalls of the gate structure, the depth of the second trench is greater than the depth of the first trench, and the depths of the second trenches decrease gradually along a direction from the top of the gate structure to the bottom of the gate structure; forming first spacers in the first trench and the second trench; and forming a source-drain doping layer in the groove after forming the first spacers.

Correspondingly, a form of the present disclosure further provides a semiconductor structure, including: a substrate; a fin, protruding from the surface of the substrate; a channel structure layer, located on the fin and spaced apart from the fin, where the channel structure layer includes at least two channel layers spaced apart; a gate structure across the channel structure layer, where the gate structure covers a part of the top of the fin and surrounds the channel layers, the gate structure between the fin and the channel layer adjacent to the fin is a first gate structure part, and the gate structure between the adjacent channel layers is a second gate structure part, along a direction perpendicular to sidewalls of the gate structure, a part of the channel layers is exposed on two sides of the first gate structure part and two sides of the second gate structure part, where the quantity of the channel layers is two, and the width of the first gate structure part is greater than the width of the gate structure part, or the quantity of the channel layers is greater than or equal to three, the width of the first gate structure part is greater than the width of the second gate structure part, and the widths of the second gate structure parts increase gradually along a direction from the top of the gate structure to the bottom of the gate structure; first spacers, located on sidewalls of the first gate structure part and sidewalls of the second gate structure part and covering the surfaces of the channel layers exposed by the first gate structure part and the second gate structure part; and a source-drain doping layer, penetrating through the channel structure layer on two sides of the gate structure.

Compared with the prior art, the technical solution of the present disclosure has the following advantages:

In the forms of the present disclosure, after the grooves are formed in the channel laminates on two sides of the gate structure, the fin, the channel layer adjacent to the fin and the remaining sacrificial layer encircle a first trench, and adjacent channel layers and the remaining sacrificial layer between the adjacent channel layers encircle a second trench. When the quantity of the channel laminates is two, the depth of the second trench is greater than the depth of the first trench. When the quantity of the channel laminates is greater than or equal to three, the depth of the second trench is greater than the depth of the first trench, and the depths of the second trenches decrease gradually along the direction from the top of the gate structure to the bottom of the gate structure. Then, the first spacers are formed in the first trenches and the second trenches. Correspondingly, along the direction from the top of the gate structure to the bottom of the gate structure, the thicknesses of the first spacers decrease gradually along the direction perpendicular to the sidewalls of the gate structure. The remaining sacrificial layer is used for occupying a spatial position for forming a metal gate structure subsequently, and the channel layer covered by the first spacers is beyond the control of the metal gate structure. Therefore, through the first trenches and the second trenches, channel regions controlled by the metal gate structure increase gradually along the direction from the top to the bottom of the gate structure, and the turn-on resistance of the channels during turn-on gradually decreases correspondingly. The distances from the source-drain doping layer to the channels increase gradually along the direction from the top to the bottom of the gate structure, so that a balance is achieved between the turn-on resistance of the channels during turn-on and the distances from the source-drain doping layer to the channels, and current density uniformity of the device during working is improved correspondingly, thereby improving the performance of the device, for example, alleviating the self-heating effect, the hot carrier injection effect ("HCI") or the like.

DETAILED DESCRIPTION

It can be appreciated from the background art that the current device performance still needs to be improved. Now, the reason why the device performance still needs to be improved is analyzed with reference to a semiconductor structure.

Figure 1:
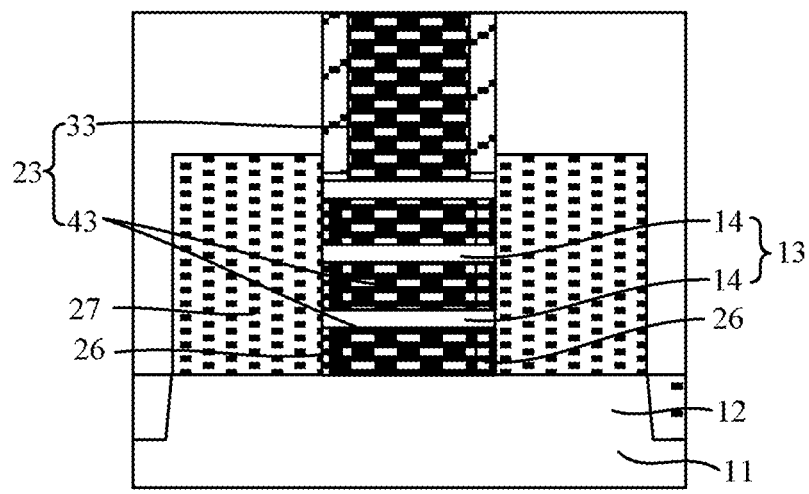
FIG. 1 is a schematic structural diagram of a semiconductor structure.

Referring to FIG. 1, FIG. 1 shows a schematic structural diagram of a semiconductor structure.

The semiconductor structure includes: a substrate 11; a fin 12, protruding from the surface of the substrate 11; a channel structure layer 13, located on the fin 12 and spaced apart from the fin 12, where the channel structure layer 13 includes at least two channel layers 14 spaced apart; and a metal gate structure 23 across the channel structure layer 13, where the metal gate structure 23 covers a part of the top of the fin 12 and surrounds the channel layers 14, along an extension direction of the fin 12, a part of the channel layers 14 is exposed on two sides of the metal gate structure 23, where the metal gate structure 23 between the fin 12 and the channel layer 14 adjacent to the fin 12 and the metal gate structure 23 between the adjacent channel layers 14 are first metal gate structure parts 43, and the remaining metal gate structure 23 is a second metal gate structure part 33; a source-drain doping layer 27, which is located in the channel structure layer 13 on two sides of the metal gate structure 23 and is in contact with the fin 12; spacers 26, located between the second metal gate structure parts 43 and the source-drain doping layer 27 and covering the surfaces of the channel layers 14 exposed by the second metal gate structure parts 43.

Each spacer 26 is disposed between the second metal gate structure part 43 and the source-drain doping layer 27 and is used for increasing a distance between a gate electrode in the second metal gate structure part 43 and the source-drain doping layer 27, so as to reduce parasitic capacitance between the gate electrode and the source-drain doping layer 27, thereby improving device performance. The spacers 26 located on sidewalls of the second metal gate structure part 43 usually have an equal thickness. The channel layers 14 covered by the spacers 26 are beyond the control of the metal gate structure 23. Therefore, along a direction from the top of the metal gate structure 23 to the bottom of the metal gate structure 23, channel regions controlled by the metal gate structure 23 are equal in size. The thickness of the spacer 26 refers to the size of the spacer 26 along a direction perpendicular to the sidewalls of the metal gate structure 23.

However, along the direction from the top to the bottom of the metal gate structure 23, a channel controlling capability of the metal gate structure 23 becomes weaker gradually, causing turn-on resistance of channels during turn-on to increase gradually. Moreover, distances from the source-drain doping layer 27 to the channels also increase gradually. Therefore, when a device works, currents flow from a drain region in the source-drain doping layer 27 to a source region in the source-drain doping layer 27 through the channel layers 14, and along the direction from the top to the bottom of the metal gate structure 23, the currents flowing through the channels decrease gradually. The current is mainly concentrated in the top channel layer 14. This not only decreases the density uniformity of the currents but also causes device performance to decline, for example, a self-heating effect or a hot carrier injection effect is caused.

In order to address the technical problem, in this form of the present disclosure, after a groove is formed in channel laminates on two sides of the gate structure, the fin, the channel layer adjacent to the fin and the remaining sacrificial layer encircle a first trench, and the adjacent channel layers and the remaining sacrificial layer between the adjacent channel layers encircle a second trench. When the quantity of the channel laminates is two, the depth of the second trench is greater than the depth of the first trench. When the quantity of the channel laminates is greater than or equal to three, the depth of the second trench is greater than the depth of the first trench, and the depths of the second trenches decrease gradually along the direction from the top of the gate structure to the bottom of the gate structure. Then, the first spacers are formed in the first trench and the second trench. Correspondingly, along the direction from the top of the gate structure to the bottom of the gate structure, the thicknesses of the first spacers decrease gradually along the direction perpendicular to the sidewalls of the gate structure. The remaining sacrificial layer is used for occupying a spatial position for forming a metal gate structure subsequently, and the channel layer covered by the first spacers is beyond the control of the metal gate structure. Therefore, through the first trenches and the second trenches, channel regions controlled by the metal gate structure increase gradually along the direction from the top to the bottom of the gate structure, and the turn-on resistance of the channels during turn-on gradually decreases correspondingly. The distances from the source-drain doping layer to the channels increase gradually along the direction from the top to the bottom of the gate structure, so that a balance is achieved between the turn-on resistance of the channels during turn-on and the distances from the source-drain doping layer to the channels, and current density uniformity of the device during working is improved correspondingly, thereby improving the performance of the device, for example, alleviating the self-heating effect, the hot carrier injection effect or the like.

To make the foregoing objectives, features and advantages of the forms of the present disclosure easier to appreciate, the specific forms of the present disclosure are described in detail below with reference to the accompanying drawings.

FIG. 2 to FIG. 14 are schematic structural diagrams corresponding to steps in a form of a method for forming a semiconductor structure.

Figure 2:
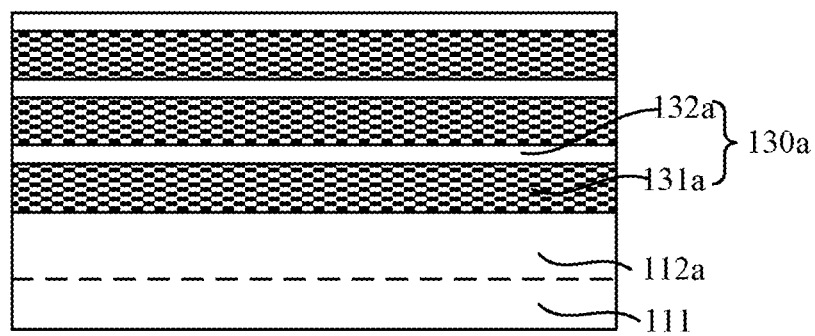
FIG. 2 to FIG. 14 are schematic structural diagrams corresponding to steps in a form of a method for forming a semiconductor structure.
Figure 3:
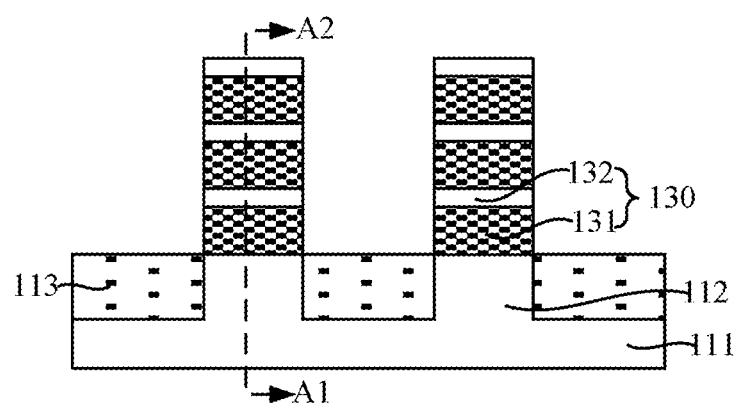
Figure 4:
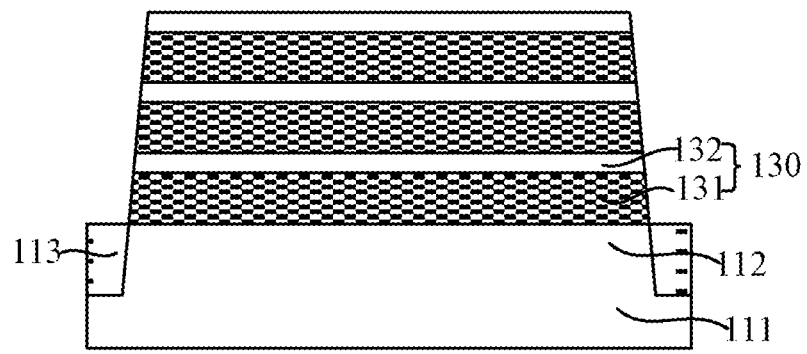

With reference to FIG. 2 to FIG. 4 in combination, FIG. 2 is a cross-sectional view, FIG. 3 is a cross-sectional view based on FIG. 2, and FIG. 4 is a cross-sectional view of FIG. 3 along a cut line in a fin extension direction (as shown by the direction A1A2 in FIG. 3). A base (not marked) is provided. The base includes a substrate 111 (as shown in FIG. 3), discrete fins 112 (as shown in FIG. 3) protruding from the substrate 111, and at least two channel laminates 130 (as shown in FIG. 3) sequentially located on the fins 112. Each channel laminate 130 includes a sacrificial layer 131 (as shown in FIG. 3) and a channel layer 132 (as shown in FIG. 3) located on the sacrificial layer 131.

The substrate 111 is used for providing a process platform for forming a GAA transistor subsequently. Specifically, the GAA transistor may be one of or both of a PMOS transistor and a NMOS transistor.

In this form, the substrate 111 is a silicon substrate. In other forms, the material of the substrate may also be germanium, silicon germanide, silicon carbide, gallium arsenide, indium arsenide or the like. The substrate may also be other types of substrates such as a silicon substrate on an insulator or a germanium substrate on an insulator. The material of the substrate may also be a material meeting process requirements or a material easy to integrate.

The fins 112 expose a part of the substrate 111, so as to provide a process foundation for forming an isolation structure subsequently. In this form, the fins 112 and the substrate 111 are of an integrated structure. In other forms, the fins may also be a semiconductor layer epitaxially grown on the substrate, thereby achieving an objective of controlling the height of the fins precisely.

Therefore, in this form, a material of the fins 112 is the same as the material of the substrate 111. The material of the fins 112 is silicon. In other forms, the material of the fins may also be a semiconductor material suitable for forming the fins, such as germanium, silicon germanide, silicon carbide, gallium arsenide or indium arsenide. The material of the fins may also be different from the material of the substrate.

The channel laminates 130 are used for providing a process foundation for forming the channel layers 132 that are arranged at intervals in a suspended manner subsequently. Specifically, the sacrificial layer 131 is used for supporting the first channel layer 132, thereby providing a process foundation for arranging the first channel layers 132 at intervals in a suspended manner subsequently, and also occupying a spatial position for forming a metal gate structure subsequently. The channel layers 132 are used for providing channels of a GAA transistor.

In this form, a material of the channel layer 132 is Si, and a material of the sacrificial layer 131 is SiGe. In a subsequent process of removing the sacrificial layers 131, SiGe and Si have a relatively high etching selectivity ratio. Therefore, by using SiGe as the material of the sacrificial layer 131 and Si as the material of the channel layer 132, impact on the channel layers 132 by the removal process of the sacrificial layers 131 can be effectively reduced, thereby improving the quality of the channel layers 132 and further improving the device performance.

In other forms, when the formed GAA transistor is a PMOS transistor, in order to improve the performance of the PMOS transistor, a SiGe channel technology can be used. Correspondingly, the materials of the fins and the channel layers are both SiGe, and the material of the sacrificial layer is Si.

In this form, three channel laminates 130 are formed on the fins 112, that is, three sacrificial layers 131 and three channel layers 132 arranged alternately are formed on the fins 112. In other forms, according to actual process requirements, the quantity of the channel laminates is not limited to three, and may also be two, four, or the like.

Specifically, the step of forming the substrate 111, the fins 112 and the channel laminates 130 includes: as shown in FIG. 2, providing a substrate 111, where a fin material layer 112a is formed on the substrate 111; forming at least two channel material laminates 130a on the fin material layer 112a, where each channel material laminate 130a includes a sacrificial material layer 131a and a channel material layer 132a located on the sacrificial material layer 131a; as shown in FIG. 3, sequentially etching the channel material laminates 130a (as shown in FIG. 2) and the fin material layer 112a (as shown in FIG. 2), to form fins 112 protruding from the substrate 111 and the channel laminates 130 on the fins 112.

In this form, the quantity of the channel laminates 130 is three, and the quantity of the channel material laminates 130a is three correspondingly.

In this form, the channel material laminates 130a are formed on the fin material layer 112a by means of epitaxial growth. Therefore, the sacrificial material layers 131a and the channel material layers 132a have relatively good forming quality. Accordingly, the quality of the sacrificial layers 131 and the channel layers 132 are also good such that channels of the formed GAA transistor are located in high-quality materials, thus helping improve device performance.

Further referring to FIG. 3 and FIG. 4, after the channel laminates 130 are formed, the method further includes: forming an isolation structure 113 on the substrate 111 exposed by the channel laminates 130, where the isolation structure 113 exposes sidewalls of the channel laminates 130.

The isolation structure 113 is used for isolating adjacent devices or adjacent channel laminates 130. In this form, a material of the isolation structure 113 is silicon oxide. In other forms, the material of the isolation structure may also be other insulating materials such as silicon nitride or silicon oxynitride.

In this form, the top surface of the isolation structure 113 is flush with the top surface of the fin 112, so as to prevent the fin 112 from being used as a channel.

Figure 5:
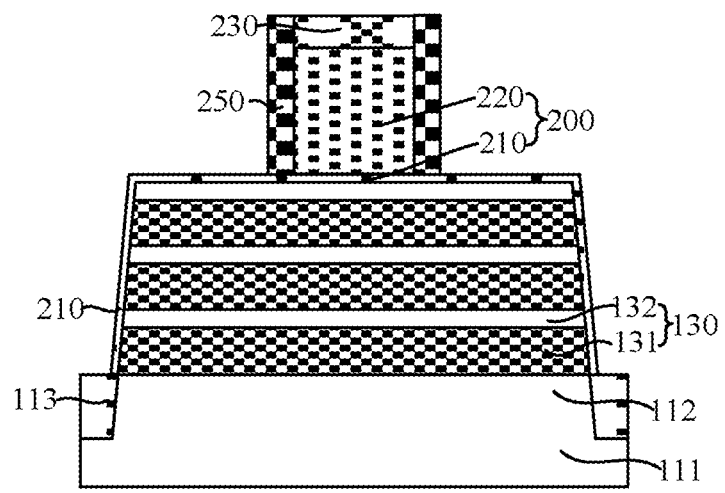

Referring to FIG. 5, FIG. 5 is a cross-sectional view based on FIG. 4. A gate structure 200 across the channel laminates 130 is formed. The gate structure 200 covers a part of the top and a part of sidewalls of the channel laminates 130.

The gate structure 200 is a dummy gate structure. The gate structure 200 is used for occupying a spatial position for forming a metal gate structure subsequently. In this form, the gate structure 200 includes a dummy gate layer 220. The dummy gate layer 220 crosses the channel laminates 130 and covers a part of the top and a part of the sidewalls of the channel laminates 130.

In this form, a material of the dummy gate layer 220 is polycrystalline silicon. In other forms, the material of the dummy gate layer may also be silicon oxide, silicon nitride, silicon oxynitride, silicon carbide, silicon carbonitride, silicon oxy-carbonitride, amorphous carbon or the like.

In this form, the dummy gate structure 200 is of a laminate structure. Therefore, as shown in FIG. 5, before the dummy gate layer 220 is formed, the method further includes: forming a gate oxide layer 210 covering the surface of the channel laminates 130. The dummy gate layer 220 and the gate oxide layer 210 at the bottom of the dummy gate layer 220 are used for forming the dummy gate structure 200. In other forms, the dummy gate structure may also be of a single-layer structure, and the dummy gate structure only includes the dummy gate layer correspondingly.

In this form, a material of the gate oxide layer 210 is silicon oxide. In other forms, the material of the gate oxide layer may also be silicon oxynitride.

Specifically, the step of forming the dummy gate structure 200 includes: after forming the gate oxide layer 210 covering the surface of the channel laminates 130, forming, on the gate oxide layer 210, a dummy gate material layer across the channel laminates 130; forming a gate mask layer 230 on the surface of the dummy gate material layer; etching the dummy gate material layer using the gate mask layer 230 as a mask to expose a part of the gate oxide layer 210, where the remaining dummy gate material layer after the etching is used as the dummy gate layer 220, and the dummy gate layer 220 covers a part of the top and a part of sidewalls of the dummy gate oxide layer 210.

It should be appreciated that, after the dummy gate layer 220 is formed, the gate mask layer 230 located at the top of the dummy gate layer 220 is retained. A material of the gate mask layer 230 is silicon nitride. The gate mask layer 230 is used for protecting the top of the dummy gate layer 220 during a subsequent process.

It should be further appreciated that, in this form, for ease of illustration, only one dummy gate structure 200 is shown. However, the quantity of gate structures 200 formed on the channel laminates 130 is not limited to one.

In addition, further referring to FIG. 5, after the gate structure 200 is formed, the method further includes: forming spacers (not marked) on sidewalls of the dummy gate layer 220.

In this form, the spacers are defined as second spacers 250. The second spacers 250 are used as etching masks in the subsequent etching process, so as to define regions for forming a source-drain doping layer subsequently.

A material of the second spacer 250 may be one or more of silicon oxide, silicon nitride, silicon carbide, silicon carbonitride, silicon oxy-carbonitride, silicon oxynitride, boron nitride and boron carbonitride, and the second spacer 250 may be of a single-layer structure or a laminate structure. In this form, the second spacer 250 is of a single-layer structure, and the material of the second spacer 250 is silicon nitride.

In this form, according to actual process requirements, the thickness of the second spacer 250 is 3 nm to 10 nm. The thickness of the second spacer 250 refers to the size of the second spacer 250 along a direction perpendicular to the sidewalls of the dummy gate layer 220.

It should be appreciated that, after the spacers 250 are formed, the gate oxide layer 210 exposed by the spacers 250 and the dummy gate layer 220 are retained. The gate oxide layer 210 can protect the channel laminates 130 in a subsequent process. In other forms, it is also possible to remove the gate oxide layer exposed by the spacers and the dummy gate layer, and only retain the gate oxide layer covered by the dummy gate layer and the spacers; the channel laminates on two sides of the dummy gate layer are exposed, to facilitate subsequent process steps.

Figure 7:
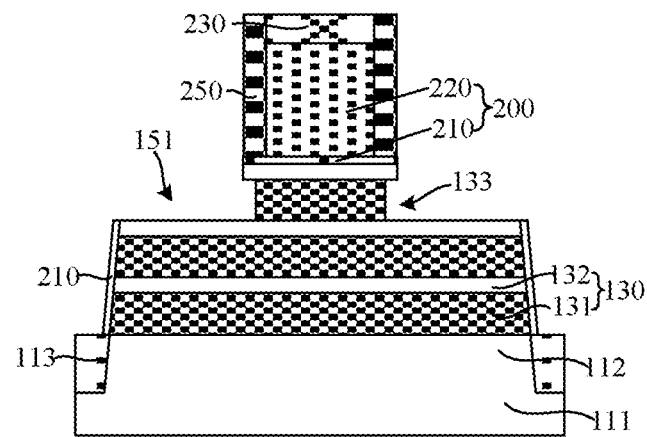
Figure 8:
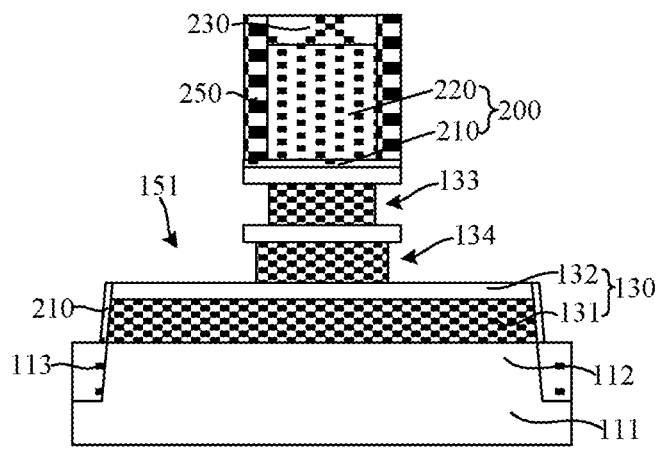
Figure 9:
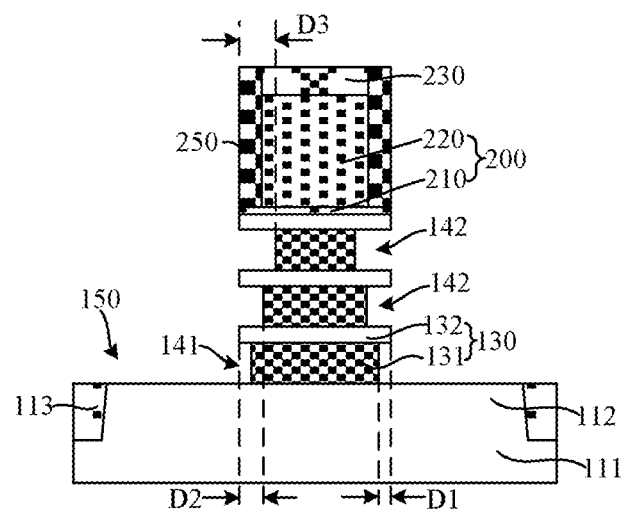

With reference to FIG. 6 to FIG. 9 in combination, the channel laminates 130 on two sides of the dummy gate layer 220 are etched, and grooves 150 (as shown in FIG. 9) that expose the fin 112 are formed in the channel laminates 130. After the grooves 150 are formed, the fin 112, the channel layer 132 adjacent to the fin 112 and the remaining sacrificial layer 131 encircle first trenches 141 (as shown in FIG. 9), and the adjacent channel layers 132 and the remaining sacrificial layer 131 located between the adjacent channel layers 132 encircle second trenches 142 (as shown in FIG. 9). The quantity of the channel laminates 130 is two, and along the direction perpendicular to the sidewalls of the gate structure 200, the depth (not marked) of the second trench 142 is greater than the depth (not marked) of the first trench 141. Alternatively, the quantity of the channel laminates 130 is greater than or equal to three; along the direction perpendicular to the sidewalls of the gate structure 200, the depth of the second trench 142 is greater than the depth of the first trench 141, and the depths of the second trenches 142 decrease gradually along the direction from the top of the gate structure 200 to the bottom of the gate structure 200.

The grooves 150 are used for providing a spatial position for forming a source-drain doping layer subsequently. The first trench 141 and the second trench 142 are used for providing spatial positions for forming first spacers subsequently.

It should be appreciated that, after the dummy gate structure 200 and the remaining sacrificial layer 131 are removed subsequently, a metal gate structure will be formed at positions of the dummy gate structure 200 and the remaining sacrificial layer 131. The first spacers are located between the metal gate structure and the source-drain doping layer subsequently formed in the grooves 150. The first spacer is used for reducing parasitic capacitance between the source-drain doping layer and a gate electrode in the metal gate structure, and a first spacer with a greater thickness can achieve a better effect of reducing the parasitic capacitance.

It should further be appreciated that, by setting the depths of the first trench 141 and the second trench 142, the thicknesses of the first spacers decrease gradually along the direction from the top to the bottom of the gate structure 200. After the grooves 150, the first trenches 141 and the second trenches 142 are formed, the remaining sacrificial layers 131 below the dummy gate layer 220 are used for occupying spatial positions for forming a metal gate structure subsequently, and the channel layers 132 covered by the first spacers are beyond the control of the metal gate structure. Therefore, by using the first trenches 141 and the second trenches 142, channel regions controlled by the metal gate structure increase in size gradually along the direction from the top to the bottom of the gate structure 200, and the turn-on resistance of the channels during turn-on gradually decreases gradually. Moreover, as the distances from the source-drain doping layer to the channels increase gradually along the direction from the top to the bottom of the gate structure 200, a balance is achieved between the turn-on resistance of the channels during turn-on and the distances from the source-drain doping layer to the channels. The current density uniformity of the current during working is improved correspondingly, so that the performance of the device is improved. For example, a self-heating effect or a hot carrier injection effect is alleviated. The thickness of the first spacer refers to the size of the first spacer along the direction perpendicular to the sidewalls of the gate structure 200.

In this form, the second spacers 250 are formed on the sidewalls of the dummy gate layer 220. Therefore, in the step of etching the channel laminates 130 on two sides of the dummy gate layer 220, etching treatment is performed on the channel laminates 130 on two sides of the dummy gate layer 220 using the second spacers 250 as masks. After the grooves 151 are formed, along an extension direction of the fin 112 (that is, along the direction perpendicular to the sidewalls of the dummy gate layer 220), the sidewalls of the channel layers 132 are flush with the sidewalls of the second spacers 250, and a part of the channel layers 132 is exposed on two sides of the remaining sacrificial layers 131 below the dummy gate layer 220.

Specifically, in order to form the grooves 150, the first trenches 141 and the second trenches 142, the step of etching the channel laminates 130 on two sides of the dummy gate layer 220 includes: performing etching treatment at least twice on the channel laminates 130 on two sides of the dummy gate layer 220, the number of times of the etching treatment is the same as the quantity of the channel laminates 130. The step of the etching treatment includes: etching one channel laminate 130 on two sides of the dummy gate layer 220 using a dry etch process; and after the dry etch process, etching the exposed sacrificial layers 131 using a wet etch process along the sidewall direction of the dummy gate layer 220.

One etching treatment includes a dry etch process and a wet etch process performed in sequence. The dry etch process has an anisotropic etching characteristic, thereby helping improve the shape quality of the grooves 150. The wet etch process has an isotropic etching characteristic, so that the dummy gate layer 220 and the sacrificial layer 131 at the bottom of the second spacer 250 can be etched along the sidewall direction of the dummy gate layer 220. Therefore, by means of the dry etch process and the wet etch process performed alternately, the first trenches 141 and the second trenches 142 can be formed while the grooves 150 are formed.

In this form, assuming that the quantity of the channel laminates 130 is three, the steps of forming the grooves 150, the first trenches 141 and the second trenches 142 are described in detail with reference to the accompanying drawings.

Figure 6:
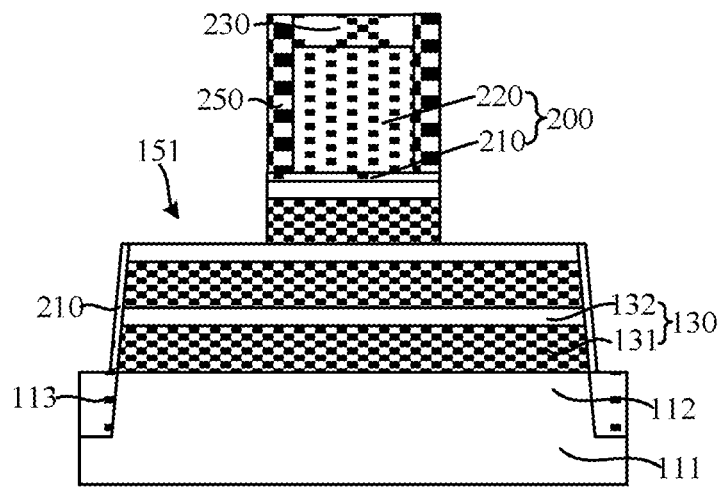

With reference to FIG. 6 and FIG. 7 in combination, with the second spacers 250 as masks, the top channel laminate 130 on two sides of the dummy gate layer 220 is etched by using a dry etch process, to form initial grooves 151 in the top channel laminate 130, where the initial grooves 151 expose the surface of the channel layer 132 of the second channel laminate 130; after the initial grooves 151 are formed, the sacrificial layer 131, which is exposed by the initial grooves 151, in the top channel laminate 130 is etched using a wet etch process.

In this form, the material of the sacrificial layer 131 is SiGe, and the material of the channel layer 132 is Si. Therefore, a main etching gas used in the dry etch process includes a fluorine-based gas, such as $CF_4$, $CHF_3$ or $C_2F_6$.

In this form, wet etching is performed on the exposed sacrificial layer 131 using HCl vapor. An etching rate of the HCl vapor with respect to the SiGe material is much higher than an etching rate with respect to the Si material. Therefore, by etching the sacrificial layer 131 exposed by the initial grooves 151 using the HCl vapor, the probability of damage on the channel layer 132 can be effectively reduced, thereby helping improve the device performance.

In this form, the percent-by-volume concentration of the HCL vapor is 0.1% to 5%, so that etching efficiency of the sacrificial layer 131 can be improved, and damage on the channel layer 132 can be avoided.

In other forms, when the materials of the channel layers and the fins are SiGe, and the material of the sacrificial layers is Si, an etching solution used in the wet etch process is correspondingly a tetramethylammonium hydroxide (TMAH) solution. An etching rate of the TMAH solution with respect to the Si material and an etching rate with respect to the SiGe material have a relatively large difference, and therefore the probability of damage on the channel layer can also be reduced when the sacrificial layer is etched using the TMAH solution.

In this form, after the first etching treatment is performed on the channel laminate 130 on two sides of the dummy gate layer 220, in the dummy gate layer 220 and the top channel laminate 130 below the spacers 250, the width of the remaining channel layer 132 along the direction perpendicular to the sidewalls of the dummy gate layer 220 is greater than the width of the remaining sacrificial layer 131 along the direction perpendicular to the sidewalls of the dummy gate layer 220; a part of the channel layer 132 is exposed on two sides of the remaining sacrificial layer 131; the channel layer 132 in the top channel laminate 130, the channel layer 132 in the second channel laminate 130, and the remaining sacrificial layer 131 between the two channel layers 132 encircle the first initial trenches 133 (as shown in FIG. 7).

Referring to FIG. 8, after the initial grooves 151 and the first initial trenches 133 are formed, the second channel laminate 130 is etched along the initial grooves 151 using a dry etch process, so that the initial grooves 151 extend into the second channel laminate 130, and expose the surface of the channel layer 132 in the bottom channel laminate 130. After the dry etch process, the sacrificial layer 131 exposed by the initial grooves 151 is etched using a wet etch process.

Therefore, in this form, after the second etching treatment is performed on the channel laminate 130 on two sides of the dummy gate layer 220, in the dummy gate layer 220 and the second channel laminate 130 below the spacers 250, the width of the remaining channel layer 132 along the direction perpendicular to the sidewalls of the dummy gate layer 220 is greater than the width of the remaining sacrificial layer 131 along the direction perpendicular to the sidewalls of the dummy gate layer 220; a part of the remaining channel layer 132 is exposed on two sides of the remaining sacrificial layer 131; the channel layer 132 in the second channel laminate 130, the channel layer 132 in the bottom channel laminate 130, and the remaining sacrificial layer 131 between the two channel layers 132 encircle second initial trenches 134.

It should be appreciated that, as the first initial trenches 133 are also exposed in the wet etch process environment of the second etching treatment, during the second etching treatment, the sacrificial layer 133 exposed by the first initial trenches 133 are also etched in the wet etch process. Therefore, after the second etching treatment is performed on the channel laminate 130 on two sides of the dummy gate layer 220, along the direction perpendicular to the sidewalls of the dummy gate layer 220, the depth of the first initial trench 133 is greater than the depth of the second initial trench 134.

For the detailed description about the step of the second etching treatment, please refer to the related description of the foregoing first etching treatment. Details are not described again in this form.

Referring to FIG. 9, after the second initial trenches 134 are formed, the bottom channel laminate 130 is etched along the initial grooves 151 using a dry etch process, so that the initial grooves 151 extend into the bottom channel laminate 130 and expose the fin 112. The initial grooves 151 after the dry etch process are used as the grooves 150. After the dry etch process, the sacrificial layer 131 exposed by the grooves 150 is etched using a wet etch process.

In this form, after the third etching treatment is performed on the channel laminate 130 on two sides of the dummy gate layer 220, in the dummy gate layer 220 and the bottom channel laminate 130 below the spacers 250, the width of the remaining channel layer 132 along the direction perpendicular to the sidewalls of the dummy gate layer 220 is greater than the width of the remaining sacrificial layer 131 along the direction perpendicular to the sidewalls of the dummy gate layer 220. A part of the remaining channel layer 132 is exposed on two sides of the remaining sacrificial layer 131. The fin 112, the channel layer 132 adjacent to the fin 112 and the remaining sacrificial layer 131 encircle first trenches 141.

Similarly, the first initial trenches 133 and the second initial trenches 134 are both exposed in the wet etch process environment of the third etching treatment. Therefore, after the third etching treatment is performed on the channel laminate 130 on two sides of the dummy gate layer 220, the depths of the first initial trench 133 and the second initial trench 134 are increased. Specifically, the first initial trenches 133 and the second initial trenches 134 after the third etching treatment are used as the second trenches 142.

For the detailed description about the step of the third etching treatment, please refer to the related description of the foregoing first etching treatment. Details are not described again in this form.

In this form, the sacrificial layer 131 in the top channel laminate 130 goes through wet etching three times, the sacrificial layer 131 in the second channel laminate 130 goes through wet etching twice, and the sacrificial layer 131 in the bottom channel laminate 130 goes through wet etching once. Therefore, along the direction perpendicular to the sidewalls of the dummy gate layer 220, the depth of the second trench 142 is greater than the depth of the first trench 141, and the depths of the second trenches 142 decrease gradually along the direction from the top to the bottom of the gate structure 200.

In this form, after the third etching treatment, the depth of the first trench 141 is a first depth D1; the depth of the second trench 142 closest to the fin 112 is a second depth D2; the depth of the second trench 142 closest to the top of the gate structure 200 is a third depth D3. The second depth D2 is greater than the first depth D1, and the second depth D2 is greater than the third depth D3.

It should be appreciated that, when the quantity of the channel laminates 130 is greater than or equal to three, the depth of the second trench 142 closest to the top of the gate structure 200 should not be excessively small or large. If the depth is excessively small, the depth of the first trench 141 and the depth of the second trench 142 are more likely to be excessively small. The thickness of the subsequent first spacer depends on the depth of the first trench 141 and the depth of the second trench 142. Therefore, the excessively small depths of the first trench 141 and the second trench 142 easily deteriorate the effect of improving the current density uniformity of the device during working, and also easily deteriorate a parasitic capacitance reduction effect of the first spacer. The excessively large depths of the first trench 141 and the second trench 142 easily cause an adverse effect on channels of the device, resulting in an excessively small channel region controlled by the metal gate structure, and consequently, the performance of the device is reduced easily. Therefore, in this form, the depth of the second trench 142 closest to the top of the gate structure 200 is 5 nm to 10 nm.

Correspondingly, when the quantity of the channel laminates 130 is greater than or equal to three, in order to improve the current density uniformity of the device during working and the parasitic capacitance reduction effect of the first spacer and to ensure that the size of the channel region controlled by the metal gate structure can meet requirements of the device performance, the depth of the first trench 141 is 3 nm to 6 nm. According to the quantity of the channel laminates 130 and the thickness of the second spacer 250, an etching amount in the wet etch process in each etching treatment is adjusted reasonably, so that the depth of the second trench 142 and the depth of the first trench 141 can meet process requirements, thereby achieving an effect of improving the device performance.

Similarly, in other forms, when the quantity of the channel laminates is two, the depth of the second trench is 5 nm to 10 nm, and the depth of the first trench is 3 nm to 6 nm.

It should be further appreciated that, in order to further improve the current density uniformity of the device during working, when the quantity of the channel laminates 130 is greater than or equal to three, adjacent second trenches 142 have an equal depth difference, and a difference between the depths of the adjacent second trenches 142 is equal to a difference between the depth of the second trench 142 closest to the fin 112 and the depth of the first trench 141.

In this form, the quantity of the channel laminates 130 is three; the first depth D1 is 3 nm to 6 nm, the second depth D2 is 4 nm to 8 nm, and the third depth D3 is 5 nm to 10 nm.

Figure 10:
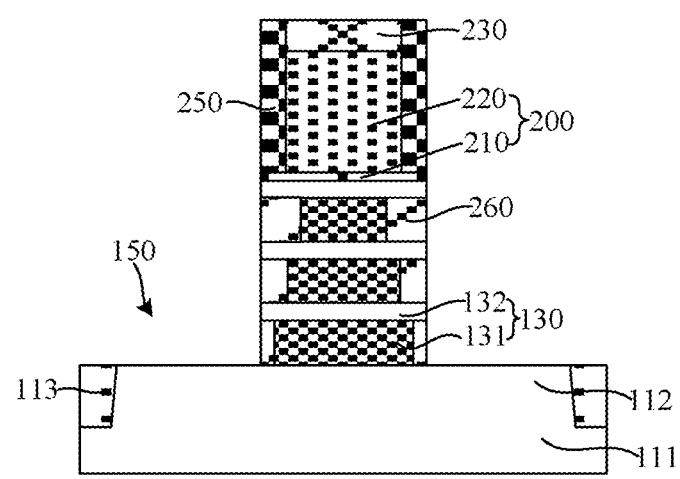

Referring to FIG. 10, the first spacers 260 are formed in the first trenches 141 (as shown in FIG. 9) and the second trenches 142 (as shown in FIG. 10).

As inner spacers, the first spacers 260 are used for covering sidewalls of the metal gate structure that is formed subsequently at the positions of the remaining sacrificial layers 131, so as to reduce parasitic capacitance between the gate electrode in the metal gate structure and the source-drain doping layer.

A material of the first spacer 260 can desirably achieve the effect of reducing the parasitic capacitance. Moreover, in order to reduce impact on the device performance, the material of the first spacer 260 is a dielectric material.

In this form, the material of the first spacer 260 is a low k dielectric material. The low k dielectric material may be SiON, SiOCN, SiCN, SiOH, SiOCH, fluorine-doped silicon dioxide ("FSG"), boron-doped silicon dioxide ("BSG"), phosphor-doped silicon dioxide ("PSG"), boron-phosphor-doped silicon dioxide ("BPSG"), hydrogen silsesquioxane ("HSQ", "(HSiO$_{1.5}$)n") or methylsilsesquioxane ("MSQ", "(CHSiO$_{1.5}$)$_n$").

The low k dielectric material refers to a dielectric material with a relative dielectric constant greater than or equal to 2.6 and less than or equal to 3.9. The selection of the low k dielectric material helps further reduce the parasitic capacitance between the gate electrode in the metal gate structure and the source-drain doping layer. In other forms, the material of the first spacer may also be silicon nitride, silicon oxynitride, silicon oxide or a super-low k dielectric material. The super-low k dielectric material refers to a dielectric material with a relative dielectric constant less than 2.6.

In this form, the first spacers 260 are formed by using a deposition process and a blanket dry etch process. Moreover, the deposition process has a desirable filling property, thereby improving the forming quality of the first spacers 260 in the first trenches 141 and the second trenches 142. Specifically, the first trenches 141 and the second trenches 142 have relatively small depths. Therefore, the deposition process may be an atomic layer deposition process. By the atomic layer deposition process, the first trenches 141 and the second trenches 142 are filled with the material of the first spacers 260. In other forms, the deposition process may also be a chemical vapor deposition process with a relatively good filling property, for example, low pressure chemical vapor deposition ("LPCVD") process.

Specifically, the step of forming the first spacers 260 includes: forming a spacer material layer (not shown in the figure) covering the top and sidewalls of the dummy gate layer 220, the sidewalls of the channel layers 132, the sidewalls of the sacrificial layers 131, and the surface of the fin 112, where the spacer material layer is further filled in the first trenches 141 and the second trenches 142; removing the spacer material layer on the top and sidewalls of the dummy gate layer 220, the sidewalls of the channel layers 132, the sidewalls of the sacrificial layers 131, and the surface of the fin 112 using a blanket dry etch process, and retaining the remaining spacer material layer in the first trenches 141 and the second trenches 142 as the first spacers 260.

It should be appreciated that, the second spacers 250 are formed on the sidewalls of the dummy gate layer 220, and the gate mask layer 230 is formed on the top of the dummy gate layer 220. Therefore, the spacer material layer further covers the sidewalls and top of the second spacers 250, the top of the gate mask layer 230 and the surface of the isolation structure 113.

Correspondingly, by the blanket dry etch process, the spacer material layer on the sidewalls and top of the spacers 250, the top of the gate mask layer 230, the sidewalls of the channel layers 132, the surface of the fin 112 and the surface of the isolation structure 113 are removed, while the spacer material layer in the first trenches 141 and the second trenches 142 is retained under the coverage of the second spacers 250 and the channel layers 132.

Figure 11:
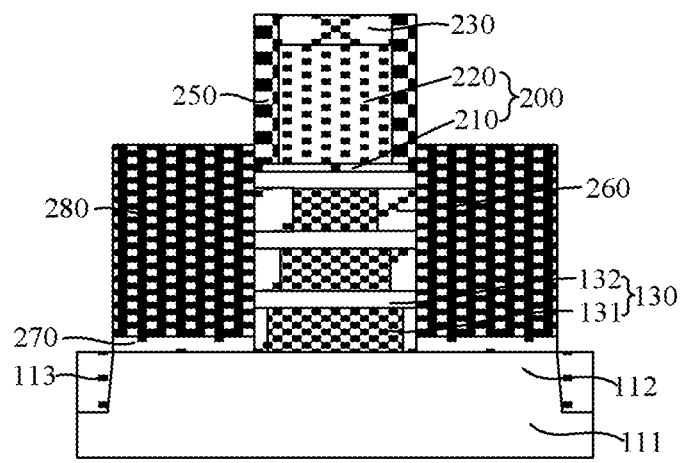

Referring to FIG. 11, after the first spacers 260 are formed in the first trenches 141 (as shown in FIG. 9) and the second trenches 142 (as shown in FIG. 9), a source-drain doping layer 280 is formed in the grooves 150 (as shown in FIG. 10).

In this form, the source-drain doping layer 280 is formed using an epitaxy process and a doping process. The source-drain doping layer 280 includes a stress layer. When the GAA transistor is a PMOS transistor, a material of the stress layer is Si or SiGe, and ions doped in the stress layer are P-type ions; when the GAA transistor is an NMOS transistor, the material of the stress layer is Si or SiC, and ions doped in the stress layer are N-type ions.

Specifically, the step of forming the source-drain doping layer 280 includes: filling a stress material in the grooves 150 using a selective epitaxy process to form the stress layer, and in-situ auto-doping ions of a corresponding type in the process of forming the stress layer, so as to form the source-drain doping layer 280. In other forms, after the stress layer is formed in the grooves, ion doping may also be performed on the stress layer to form the source-drain doping layer.

In this form, the top of the source-drain doping layer 280 is higher than the top of the channel laminates 130, and the source-drain doping layer 280 further covers a part of the sidewalls of the spacers 250. In other forms, the top of the source-drain doping layer may also be flush with the top of the channel laminates.

It should be appreciated that, after the first spacers 260 are formed in the first trenches 141 and the second trenches 142 and before the source-drain doping layer 280 is formed in the grooves 150, the method further includes: forming an isolation layer 270 at the bottom of the grooves 150.

The isolation layer 270 is used for isolating the source-drain doping layer 280 from the fin 112 at the bottom of the grooves 150, so as to reduce a leakage current between the source-drain doping layer 280 and the fin 112 at the bottom of the grooves 150, thereby helping improve the device performance.

In this form, a material of the isolation layer 270 is silicon oxide. Silicon oxide is a low-cost dielectric material commonly used in the process, and has relatively high process compatibility, thereby helping reduce the process difficulty and process cost of forming the isolation layer 270 and also helping avoid an adverse effect on the device performance. In addition, silicon oxide has a relatively small dielectric constant. The selection of the silicon oxide material further helps reduce parasitic capacitance between the source-drain doping layer 280 and the fin 112. In other forms, the material of the isolation layer may also be silicon oxynitride or silicon nitride.

The thickness (not marked) of the isolation layer 270 should not be excessively small or large. If the thickness of the isolation layer 270 is excessively small, the isolation layer 270 has a relatively poor effect of isolating the source-drain doping layer 280 from the fin 112 at the bottom of the grooves 150 and a relatively poor effect of improving the device performance. An excessively large thickness of the isolation layer 270 easily causes the isolation layer 270 to occupy an excessively large space in the grooves 150. As a result, the source-drain doping layer 280 is excessively small in size, which easily lowers the device performance. Therefore, in this form, the thickness of the isolation layer 270 is 3 nm to 10 nm. The thickness of the isolation layer 270 refers to the size of the isolation layer 270 along the normal direction of the surface of the substrate 111.

Specifically, the step of forming the isolation layer 270 at the bottom of the grooves 150 includes: filling an isolation material in the grooves 150; etching to remove partial thickness of the isolation material, and retaining the remaining isolation material at the bottom of the grooves as the isolation layer.

In this form, in order to avoid affecting the channel layers 132, the isolation material is filled in the grooves 150 using a chemical vapor deposition process.

In this form, etching is performed using a dry etch process to remove partial thickness of the isolation material. The dry etch process has an anisotropic etching characteristic, which helps improve the process operability of etching the isolation material and improve the thickness uniformity of the isolation layer 270.

Figure 12:
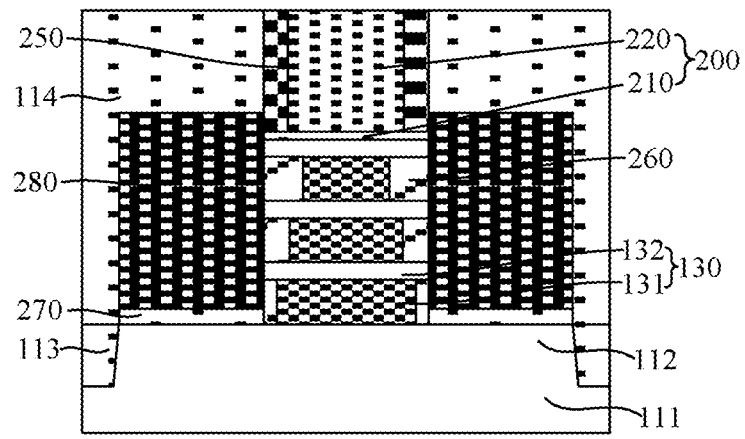

It should be further appreciated that, after the source-drain doping layer 280 is formed in the grooves 150, a subsequent process further includes:

Referring to FIG. 12, forming an interlayer dielectric layer 114 on the substrate 111 exposed by the gate structure 200, where the interlayer dielectric layer 114 covers the source-drain doping layer 280 and exposes the top of the gate structure 200.

The interlayer dielectric layer 114 is used for implementing electric isolation between adjacent semiconductor structures, and is further used for defining the size and position of a subsequent metal gate structure. A material of the interlayer dielectric layer 114 is an insulating material. In this form, the material of the interlayer dielectric layer 114 is silicon oxide. In other forms, the material of the interlayer dielectric layer may also be another dielectric material such as silicon nitride or silicon oxynitride.

Specifically, the step of forming the interlayer dielectric layer 114 includes: forming a dielectric material layer on the substrate 111 exposed by the dummy gate layer 220, where the dielectric material layer covers the top of the dummy gate layer 220; performing planarization treatment on the dielectric material layer, to remove the dielectric material layer higher than the top of the dummy gate layer 220, where the remaining dielectric material layer after the planarization treatment is used as the interlayer dielectric layer 114.

In this form, the dielectric material layer covers the top of the gate mask layer 230 (as shown in FIG. 11). Therefore, in the process of forming the interlayer dielectric layer 114, the gate mask layer 230 is further removed.

Figure 13:
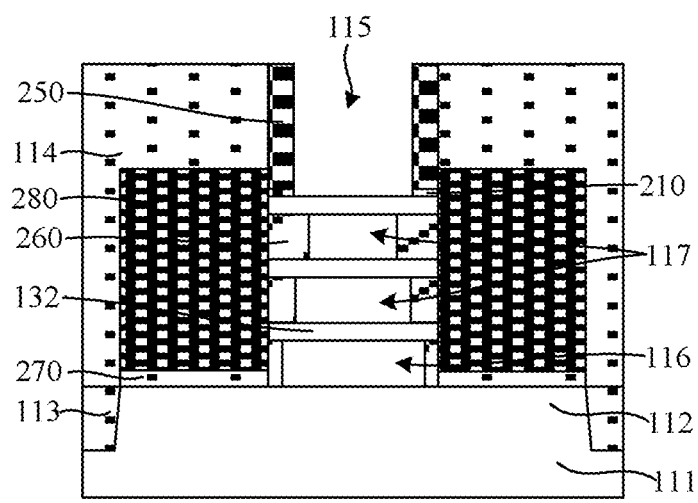

Referring to FIG. 13, the gate structure 200 is removed, and a gate opening 115 exposing the channel laminates 130 (as shown in FIG. 12) is formed in the interlayer dielectric layer 114; the sacrificial layer 131 (as shown in FIG. 12) exposed by the gate opening 115 is removed. A first gap 116 in communication with the gate opening 115 is formed between the fin 112 and the channel layer 132 adjacent to the fin 112, and a second gap 117 in communication with the gate opening 115 is formed between the adjacent channel layers 132.

In this form, the dummy gate layer 220 crosses the channel laminates 130 and covers a part of the top and a part of the surface of the sidewalls of the channel laminates 130. Therefore, after the dummy gate layer 220 and the gate oxide layer 210 at the bottom of the dummy gate layer 220 are removed, the gate opening 115 at least exposes a part of the top and a part of the sidewalls of the channel laminates 130. Specifically, after the gate opening 115 is formed, the channel laminates 130 protrude from the gate opening 115; along a direction perpendicular to the extension direction of the fin 112, the gate opening 115 exposes the sidewalls of the remaining sacrificial layers 131.

In this form, the sacrificial layer 131 exposed by the gate opening 115 is removed by means of wet etching. Specifically, the material of the channel layer 132 is Si, and the material of the sacrificial layer 131 is SiGe. Therefore, the sacrificial layer 131 exposed by the gate opening 115 is removed using HCl vapor; an etching rate of the wet etch process with respect to the sacrificial layer 131 is much higher than etching rates with respect to the channel layer 132 and the fin 112.

It should be appreciated that, the sacrificial layer 131 is removed after the source-drain doping layer 280 is formed. Therefore, after the sacrificial layer 131 exposed by the gate opening 115 is removed, along the extension direction of the fin 112, two ends of the channel layer 132 are connected to the source-drain doping layer 280, and the channel layer 132 is suspended in the gate opening 115, so that a subsequent metal gate structure can surround the channel layer 132.

Figure 14:
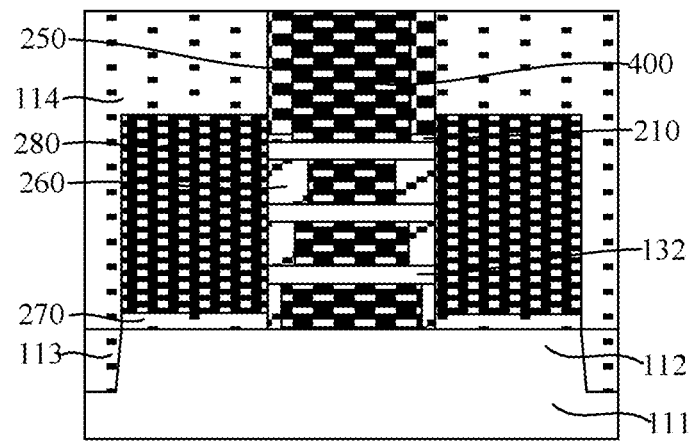

Referring to FIG. 14, the metal gate structure 400 is formed in the gate opening 115 (as shown in FIG. 13), the first gap 116 (as shown in FIG. 13) and the second gap 117 (as shown in FIG. 13).

In this form, the gate opening 115 is in communication with the first gap 116 and the second gap 117. Therefore, after the metal gate structure 400 is formed in the gate opening 115, the metal gate structure 400 will also be formed in the first gap 116 and the second gap 117. The metal gate structure 400 can surround the channel layer 132 from all directions of the channel layer 132 exposed by the gate opening 115, and can further cover the top of the fin 112. That is, the metal gate structure 400 can cover the upper surface, the lower surface and the side surfaces of the channel layer 132 as well as a part of the top and a part of the sidewalls of the fin 112.

In this form, the metal gate structure 400 includes a gate dielectric layer (not shown in the figure) and a gate electrode (not shown in the figure) located on the gate dielectric layer. Specifically, the gate dielectric layer covers the upper surface, the lower surface and the side surfaces of each channel layer 132 as well as a part of the top and a part of the sidewalls of the fin 112.

In this form, a material of the gate dielectric layer is a high k dielectric material. The high k dielectric material refers to a dielectric material with a relative dielectric constant greater than that of silicon oxide. Specifically, the material of the gate dielectric layer is $HfO_2$. In other forms, the material of the gate dielectric layer may also be selected from $ZrO_2$, HfSiO, HfSiON, HfTaO, HfTiO, HfZrO, $Al_2O_3$ or the like.

In this form, the material of the gate electrode is W. In other forms, the material of the gate electrode may also be a conductive material such as Al, Cu, Ag, Au, Pt, Ni or Ti.

The sacrificial layer 131 between the first spacers 260 is used for occupying a spatial position for forming the metal gate structure 400. The thicknesses of the first spacers 260 decrease gradually along the direction from the top to the bottom of the metal gate structure 400, and the sidewalls of the first spacers 260 are flush with the sidewalls of the second spacers 250. Therefore, the areas of the channel layers 132 covered by the metal gate structure 400 increase gradually along the direction from the top to the bottom of the metal gate structure 400. That is, channel regions controlled by the metal gate structure 400 expand gradually, the channel controlling capability of the metal gate structure 400 grows gradually, and the turn-on resistance of the channels during turn-on gradually decreases correspondingly. Distances from the source-drain doping layer 280 to the channels increase gradually, so that a balance is achieved between the turn-on resistance of the channels during turn-on and the distances from the source-drain doping layer 280 to the channels, thereby correspondingly improving the current density uniformity of the device during working and further improving the device performance.

Figure 15:
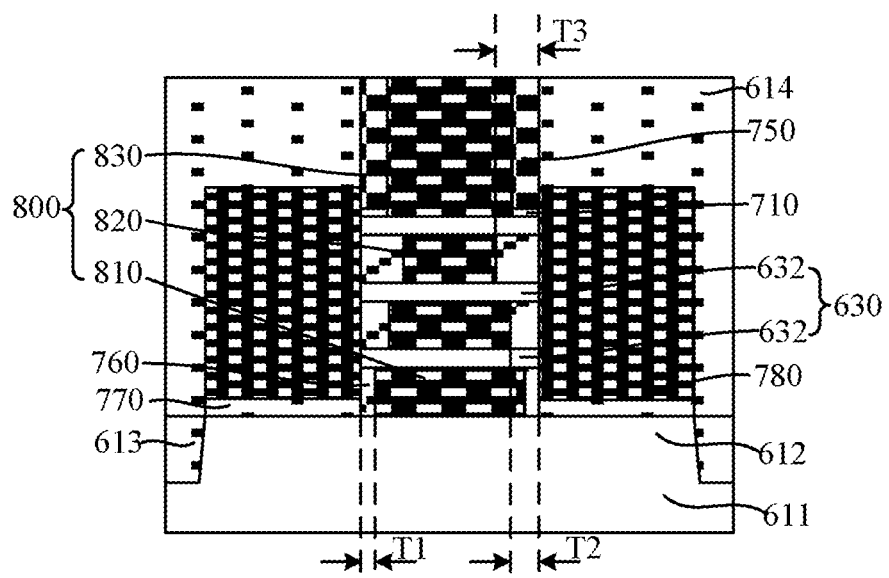
FIG. 15 is a schematic structural diagram of a form of a semiconductor structure.

Correspondingly, the present disclosure further provides a semiconductor structure. Referring to FIG. 15, FIG. 15 is a schematic structural of a form of a semiconductor structure.

The semiconductor structure includes: a substrate 611; a fin 612, protruding from the surface of the substrate 611; a channel structure layer 630, located on the fin 612 and spaced apart from the fin 612, where the channel structure layer 630 includes at least two channel layers 632 spaced apart; and a gate structure 800 across the channel structure layer 630, where the gate structure 800 covers a part of the top of the fin 612 and surrounds the channel layers 632, the gate structure 800 between the fin 612 and the channel layer 632 adjacent to the fin 612 is a first gate structure part 810, and the gate structure 800 between the adjacent channel layers 632 is a second gate structure part 820, where along a direction perpendicular to sidewalls of the gate structure 800, a part of the channel layers 632 is exposed on two sides of the first gate structure part 810 and two sides of the second gate structure part 820, where the quantity of the channel layers 630 is two, the width of the first gate structure part 810 is greater than the width of the gate structure part 820, or the quantity of the channel layers 630 is greater than or equal to three, the width of the first gate structure part 810 is greater than the width of the second gate structure part 820, and the widths of the second gate structure parts 820 increase gradually along a direction from the top of the gate structure 800 to the bottom of the gate structure 800; first spacers 760, located on sidewalls of the first gate structure part 810 and sidewalls of the second gate structure part 820 and covering the surfaces of the channel layers 632 exposed by the first gate structure part 810 and the second metal gate structure part 820; and a source-drain doping layer 780, penetrating through the channel structure layer 630 on two sides of the gate structure 800.

The substrate 611 is used for providing a process platform for forming a GAA transistor. Specifically, the GAA transistor may be one of or both of a PMOS transistor and a NMOS transistor.

In this form, the substrate 611 is a silicon substrate. In other forms, the material of the substrate may also be germanium, silicon germanide, silicon carbide, gallium arsenide, indium arsenide or the like. The substrate may also be other types of substrates such as a silicon substrate on an insulator or a germanium substrate on an insulator. The material of the substrate may be a material meeting process requirements or a material easy to integrate.

In this form, the fin 612 and the substrate 611 are of an integrated structure. A material of the fin 612 is the same as the material of the substrate 611. The material of the fin 612 is silicon. In other forms, the material of the fin may also be a semiconductor material suitable for forming the fin, such as germanium, silicon germanide, silicon carbide, gallium arsenide or indium arsenide. The material of the fin may also be different from the material of the substrate.

The fin 612 exposes a part of the substrate 611, so as to provide a process foundation for forming an isolation structure.

Therefore, in this form, the semiconductor structure further includes: an isolation structure 613, located on the substrate 611 exposed by the fin 612.

The isolation structure 613 is used for isolating adjacent devices. In this form, a material of the isolation structure 613 is silicon oxide. In other forms, the material of the isolation structure may also be other insulating materials such as silicon nitride or silicon oxynitride.

In this form, the top of the isolation structure 613 is flush with the top surface of the fin 612, so as to prevent the fin 612 from being used as a channel.

The channel structure layer 630 is located on the fin 612 and spaced apart from the fin 612. The channel structure layer 630 includes at least two channel layers 632 spaced apart, so that the metal gate structure 800 can surround the channel layers 632.

Channels of the GAA transistor are located in the channel structure layer 630 (that is, the channel layers 632). In this form, a material of the channel layers 632 is the same as the material of the fin 612, and the material of the channel layers 632 is Si.

In other forms, when the GAA transistor is a PMOS transistor, in order to improve performance of the PMOS transistor, a SiGe channel technology is generally used. Correspondingly, the materials of the fin and the channel layers are both SiGe.

In this form, the channel structure layer 630 includes three channels layers 632 spaced apart. In other forms, according to actual process requirements, the quantity of the channel layers is not limited to three, and may also be two, four, or the like.

In this form, the gate structure 800 crosses the channel structure layer 630. The gate structure 800 surrounds the channel layers 632 and further covers a part of the top of the fin 612. That is, the gate structure 800 covers the upper surface, the lower surface and the side surfaces of each channel layer 632 as well as a part of the top of the fin 612.

In this form, the gate structure 800 is a metal gate structure. The gate structure 800 includes a gate dielectric layer (not marked) and a gate electrode (not marked) located on the gate dielectric layer. The channels of the GAA transistor are located in the channel layers 632 and the fin 612. Therefore, the gate dielectric layer covers the upper surface, the lower surface and the side surfaces of each channel layer 632 as well as a part of the top of the fin 612.

A material of the gate dielectric layer is a high k dielectric material. The high k dielectric material refers to a dielectric material with a relative dielectric constant greater than that of silicon oxide. In this form, the material of the gate dielectric layer is $HfO_2$. In other forms, the material of the gate dielectric layer may also be selected from $ZrO_2$, HfSiO, HfSiON, HfTaO, HfTiO, HfZrO, $Al_2O_3$ or the like.

In this form, the material of the gate electrode is W. In other forms, the material of the gate electrode may also be Al, Cu, Ag, Au, Pt, Ni, Ti or the like.

In this form, when the quantity of the channel layers 632 is two, along a direction perpendicular to the sidewalls of the gate structure 800, the width of the first gate structure part 810 is greater than the width of the second gate structure part 820; or when the quantity of the channel layers is greater than or equal to three, along the direction perpendicular to the sidewalls of the gate structure 800, the width of the first gate structure part 810 is greater than the width of the second gate structure part 820, and the widths of the second gate structure parts 820 increase gradually along the direction from the top to the bottom of the gate structure 800. Therefore, the areas of the channel layers 632 covered by the gate structure 800 increase gradually along the direction from the top to the bottom of the gate structure 800. That is, channel regions controlled by the gate structure 800 expand gradually, the channel controlling capability of the gate structure 800 grows gradually, and the turn-on resistance of the channels during turn-on gradually decreases correspondingly. Distances from the top of the source-drain doping layer 780 to the channels increase gradually. Therefore, by the first gate structure part 810 and the second gate structure parts 820 with different widths, a balance is achieved between the turn-on resistance of the channels during turn-on and the distances from the top of the source-drain doping layer 280 to the channels, thereby correspondingly improving the current density uniformity of the device during working and further improving the device performance.

As inner spacers, the first spacers 760 are located on the sidewalls of the first gate structure part 810 and the second gate structure part 820, thereby increasing the distances from gate electrodes in the first gate structure part 810 and the second gate structure part 820 to the source-drain doping layer 780. Therefore, parasitic capacitance between the source-drain doping layer 780 and the gate electrodes in the first gate structure part 810 and the second gate structure part 820 is reduced, thereby improving the device performance.

A material of the first spacer 760 can desirably achieve the effect of reducing the parasitic capacitance. Moreover, in order to reduce impact on the device performance, the material of the first spacer 760 is a dielectric material.

In this form, the material of the first spacer 760 is a low k dielectric material. The low k dielectric material refers to a dielectric material with a relative dielectric constant greater than or equal to 2.6 and less than or equal to 3.9. The selection of the low k dielectric material helps further reduce the parasitic capacitance between the gate electrode in the metal gate structure and the source-drain doping layer 780. In other forms, the material of the first spacer may also be silicon nitride, silicon oxynitride, silicon oxide or a super-low k dielectric material. The super-low k dielectric material refers to a dielectric material with a relative dielectric constant less than 2.6.

The first spacers 760 cover the surfaces of the channel layers 632 exposed by the first gate structure part 810 and the second gate structure part 820. Correspondingly, the thicknesses of the first spacers 760 decrease gradually along the direction from the top to the bottom of the gate structure 800. The thickness of the first spacer 760 refers to the size of the first spacer 760 along the direction perpendicular to the sidewalls of the gate structure 800.

In this form, the thickness of the first spacer 760 located on the sidewall of the first gate structure part 810 is a first thickness T1; the thickness of the first spacer 760 located on the sidewall of the second gate structure part 820 closest to the first gate structure part 810 is a second thickness T2; the thickness of the first spacer 760 located on the sidewall of the second gate structure part 820 closest to the channel structure layer 630 is a third thickness T3. The second thickness T2 is greater than the first thickness T1, and the second thickness T2 is greater than the third thickness T3.

It should be appreciated that, when the quantity of the channel layers 632 is greater than or equal to three, the thickness of the first spacer 760 located on the sidewall of the second gate structure part 820 closest to the top of the channel structure layer 630 should not be excessively small or large. If the thickness is excessively small, the thickness of the first spacer 760 on the sidewall of the first gate structure part 810 and the first spacer 760 on the sidewall of the remaining second gate structure part 820 are more likely to be excessively small. Therefore, it easily deteriorates the effect of improving the current density uniformity of the device during working, and also easily deteriorates a parasitic capacitance reduction effect of the first spacer 760. If the thickness is excessively large, the width of the second gate structure part 820 closest to the top of the channel structure layer 630 is likely to be excessively small, and the width of the remaining second gate structure part 820 and the width of the first gate structure part 810 will also be affected correspondingly, thus easily causing an adverse effect on channels of the device, resulting in an excessively small channel region controlled by the gate structure 800; the performance of the device is reduced easily. Therefore, in this form, the thickness of the first spacer 760 located on the sidewall of the second gate structure part 820 closest to the top of the channel structure layer 630 is 5 nm to 10 nm.

Correspondingly, when the quantity of the channel layers 632 is greater than or equal to three, in order to improve the current density uniformity of the device during working and the parasitic capacitance reduction effect of the first spacers 760 and to ensure that the size of the channel region controlled by the gate structure can meet requirements of the device performance, the thickness of the first spacer 760 located on the sidewall of the first gate structure part 810 is 3 nm to 6 nm. According to the quantity of the channel layer 632, the thickness of the first spacer 760 on the sidewall of the first gate structure part 810 and the thickness of the first spacer 760 located on the sidewall of the second gate structure part 820 are adjusted reasonably, thereby achieving an effect of improving the device performance.

Similarly, in other forms, when the quantity of the channel structure layers is two, the thickness of the first spacer on the sidewall of the first gate structure part is 3 nm to 6 nm, and the thickness of the first spacer on the sidewall of the second gate structure part is 5 nm to 10 nm.

It should be further appreciated that, in order to further improve the current density uniformity of the device during working, when the quantity of the channel layers 632 is greater than or equal to three, along the direction from the top of the gate structure 800 to the bottom of the gate structure 800, adjacent first spacers 760 have an equal thickness difference, that is, the first spacers 760 on the sidewalls of the adjacent second gate structure parts 810 have an equal thickness difference, and a thickness difference between the first spacers 760 on the sidewalls of the second gate structure parts 810 is equal to a thickness difference between the first spacer 760 on the sidewall of the second gate structure part 820 closest to the fin 612 and the first spacer 760 on the sidewall of the first gate structure part 810.

In this form, the quantity of the channel structure layers 630 is three, the first thickness T1 is 3 nm to 6 nm, the second thickness T2 is 4 nm to 8 nm, and the third thickness T3 is 5 nm to 10 nm.

In this form, the remaining gate structure 800 is a third gate structure part 830. The third gate structure part 830 covers a part of the top and a part of sidewalls of the channel structure layers 630. The semiconductor structure further includes: second spacers 750, where the second spacers 750 cover the sidewalls of the third gate structure part 830, and the sidewalls of the second spacer 750 are flush with the sidewalls of the first spacers 760.

The sidewalls of the second spacers 750 are flush with the sidewalls of the first spacers 760. Therefore, sidewalls of the second spacers 750 are flush with the sidewalls of the channel layers 632, and the second spacers 750 further cover the top and sidewalls of the channel structure layer 630 on two sides of the third gate structure part 830.

A material of the second spacer 750 may be one or more of silicon oxide, silicon nitride, silicon carbide, silicon carbonitride, silicon oxy-carbonitride, silicon oxynitride, boron nitride and boron carbonitride. The second spacer 750 may be of a single-layer structure or a laminate structure. In this form, the second spacer 750 is of a single-layer structure, and the material of the second spacer 750 is silicon nitride.

In this form, according to actual process requirements, the thickness of the second spacer 750 is 3 nm to 10 nm. The thickness of the second spacer 750 refers to the size of the second spacer 750 along the direction perpendicular to the sidewalls of the gate structure 800.

In this form, the source-drain doping layer 780 includes a stress layer doped with ions. Specifically, when the GAA transistor is a PMOS transistor, a material of the stress layer is Si or SiGe, and ions doped in the stress layer are P-type ions; when the GAA transistor is an NMOS transistor, the material of the stress layer is Si or SiC, and ions doped in the stress layer are N-type ions.

In this form, the top of the source-drain doping layer 780 is higher than the top of the channel structure layer 630, and the source-drain doping layer 780 further covers a part of sidewalls of the spacers 750. In other forms, the top of the source-drain doping layer may also be flush with the top of the channel structure layer.

It should be appreciated that, the semiconductor structure further includes: an isolation layer 770, located between the bottom of the source-drain doping layer 780 and the fin 612. The isolation layer 770 is used for isolating the source-drain doping layer 780 from the fin 612, so as to reduce a leakage current between the source-drain doping layer 780 and the fin 612, thereby helping improve the device performance.

In this form, a material of the isolation layer 770 is silicon oxide. Silicon oxide is a low-cost dielectric material commonly used in the process, and has relatively high process compatibility, thereby helping reduce the process difficulty and process cost of forming the isolation layer 770 and also helping avoid an adverse effect on the device performance. In addition, silicon oxide has a relatively small dielectric constant. The selection of the silicon oxide material further helps reduce parasitic capacitance between the source-drain doping layer 780 and the fin 612. In other forms, the material of the isolation layer may also be silicon oxynitride or silicon nitride.

The thickness (not marked) of the isolation layer 770 should not be excessively small or large. If the thickness of the isolation layer 770 is excessively small, the isolation layer 770 has a relatively poor effect of isolating the source-drain doping layer 780 from the fin 612 and a relatively poor effect of improving the device performance. An excessively large thickness of the isolation layer 770 easily causes the source-drain doping layer 780 to be excessively small in size, which easily lowers the device performance. Therefore, in this form, the thickness of the isolation layer 770 is 3 nm to 10 nm. The thickness of the isolation layer 770 refers to the size of the isolation layer 770 along the normal direction of the surface of the substrate 611.

In this form, the semiconductor further includes: an interlayer dielectric layer 614, located on the substrate 611 exposed by the gate structure 800, where the interlayer dielectric layer 614 covers the source-drain doping layer 780 and exposes the top of the gate structure 800.

The interlayer dielectric layer 614 is used for implementing electric isolation between adjacent semiconductor structures. The interlayer dielectric layer 614 is further used for defining the size and position of the gate structure 800. A material of the interlayer dielectric layer 614 is an insulating material. In this form, the material of the interlayer dielectric layer 614 is silicon oxide. In other forms, the material of the interlayer dielectric layer may also be another dielectric material such as silicon nitride or silicon oxynitride.

It should be further appreciated that, in this form, the gate structure 800 is formed using a high k last metal gate last process, and before the gate structure 800 is formed, a dummy gate structure used is of a laminate structure. Therefore, the semiconductor structure further includes: a gate oxide layer 710 located between the second spacer 750 and the channel structure layer 630. In the process of removing the dummy gate structure to form the gate structure 800, the gate oxide layer 710 between the second spacer 750 and the channel structure layer 630 is retained under the protection of the second spacer 750.

In this form, a material of the gate oxide layer 710 is silicon oxide. In other forms, the material of the gate oxide layer may also be silicon oxynitride. In other forms, when the dummy gate structure used is of a single-layer structure, the semiconductor structure may not include the gate oxide layer.

The semiconductor structure in this form may be formed by using the forming method in the foregoing form, and may also be formed by using other forming methods. For the specific description about the semiconductor structure in this form, reference can be made to the corresponding description in the foregoing form, and details are not described again in this form.

Although the present disclosure is disclosed above, the present disclosure is not limited thereto. Any person skilled in the art can make various changes and modifications without departing from the spirit and scope of the present disclosure. Therefore, the protection scope of the present disclosure should be subject to the scope defined by the claims.

What is claimed is:

1. A method for forming a semiconductor structure, comprising:
    providing a base, wherein the base comprises:
        a substrate,
        a fin protruding from the substrate, and
        at least two channel laminates sequentially located on the fin, where each channel laminate of the at least two channel laminates comprises a sacrificial layer and a channel layer located on the sacrificial layer;
    forming a gate structure across the channel laminates, wherein the gate structure covers a part of a top and a part of sidewalls of the channel laminates;
    etching the channel laminates on two sides of the gate structure to form, in the channel laminates, a groove that exposes the fin and to remove a portion of the sacrificial layer, wherein:
        after the groove is formed, a part of the channel layer is exposed on two sides of a remaining sacrificial layer below the gate structure;
        the fin, the channel layer adjacent to the fin and the remaining sacrificial layer encircle a first trench;
        adjacent channel layers and a remaining sacrificial layer between the channel layers encircle a second trench, wherein the quantity of the channel laminates is two, and along a direction perpendicular to sidewalls of the gate structure, a lateral depth of the second trench measured from an edge of the channel layer is greater than a lateral depth of the first trench measured from the edge of the channel layer, or the quantity of the channel laminates is greater than or equal to three, and along the direction perpendicular to the sidewalls of the gate structure, the lateral depth of the second trench is greater than the lateral depth of the first trench, and lateral depths of second trenches decrease gradually along a direction from a top of the gate structure to a bottom of the gate structure;
    forming first spacers in the first trench and the second trench; and
    forming a source-drain doping layer in the groove after forming the first spacers.

2. The method for forming a semiconductor structure according to claim 1, wherein the step of etching the channel laminates on two sides of the gate structure comprises:
    performing etching treatment on the channel laminates on two sides of the gate structure at least twice, where the number of times of the etching treatment is the same as the quantity of the channel laminates; and
    wherein the step of the etching treatment comprises:
        etching one channel laminate on two sides of the gate structure using a dry etch process; and
        after the dry etch process, etching an exposed sacrificial layer along a sidewall direction of the gate structure using a wet etch process.

3. The method for forming a semiconductor structure according to claim 2, wherein a material of the sacrificial layer is SiGe, and a material of the channel layer is Si; and
    wherein in the step of etching an exposed sacrificial layer along a sidewall direction of the gate structure using a wet etch process, the exposed sacrificial layer is etched using HCl vapor.

4. The method for forming a semiconductor structure according to claim 1, wherein the quantity of the channel laminates is two, and after the first trench and the second trench are formed, the lateral depth of the second trench is 5 nm to 10 nm, and the lateral depth of the first trench is 3 nm to 6 nm; or
    the quantity of the channel laminates is greater than or equal to three, and after the first trench and the second trenches are formed, the lateral depth of the second trench closest to the top of the gate structure is 5 nm to 10 nm, and the lateral depth of the first trench is 3 nm to 6 nm.

5. The method for forming a semiconductor structure according to claim 1, wherein:
the quantity of the channel laminates is greater than or equal to three, and
after the first trench and the second trenches are formed, along the direction from the top of the gate structure to the bottom of the gate structure, a difference between lateral depths of the adjacent second trenches is equal to a difference between the lateral depth of the second trench closest to the fin and the lateral depth of the first trench.

6. The method for forming a semiconductor structure according to claim 1, wherein after the gate structure across the channel laminates is formed, and before the channel laminates on two sides of the gate structure are etched, the method further comprises:
forming second spacers on the sidewalls of the gate structure; and
the step of etching the channel laminates on two sides of the gate structure comprises: performing etching treatment on the channel laminates on two sides of the gate structure using the second spacers as masks.

7. The method for forming a semiconductor structure according to claim 1, wherein a material of the first spacer is silicon nitride, silicon oxynitride, silicon oxide, a low k dielectric material or a super-low k dielectric material.

8. The method for forming a semiconductor structure according to claim 1, wherein a process of forming first spacers in the first trench and the second trench comprises an atomic layer deposition process or a chemical vapor deposition process.

9. The method for forming a semiconductor structure according to claim 1, wherein after the first spacers are formed and before the source-drain doping layer is formed in the groove, the method further comprises: forming an isolation layer at the bottom of the groove.

10. The method for forming a semiconductor structure according to claim 9, wherein a material of the isolation layer is silicon oxide, silicon nitride or silicon oxynitride.

11. The method for forming a semiconductor structure according to claim 9, wherein a thickness of the isolation layer along a normal direction of a top surface of the substrate is 3 nm to 10 nm.

12. The method for forming a semiconductor structure according to claim 9, wherein the step of forming an isolation layer at the bottom of the groove comprises:
filling an isolation material in the groove; and
etching to remove partial thickness of the isolation material, and retaining a remaining isolation material at the bottom of the groove as the isolation layer.

13. The method for forming a semiconductor structure according to claim 1, wherein a material of the sacrificial layer is SiGe, and a material of the channel layer is Si; or a material of the sacrificial layer is Si, and a material of the channel layer is SiGe.

14. A semiconductor structure, comprising:
a substrate;
a fin, protruding from a surface of the substrate;
a channel structure layer, located on the fin and spaced apart from the fin, wherein the channel structure layer comprises at least two channel layers spaced apart;
a gate structure across the channel structure layer, wherein:
the gate structure covers a part of a top of the fin and surrounds the channel layers;
the gate structure between the fin and a channel layer adjacent to the fin is a first gate structure part;
the gate structure between adjacent channel layers is a second gate structure part;
along a direction perpendicular to sidewalls of the gate structure, a part of the channel layers is exposed on two sides of the first gate structure part and two sides of the second gate structure part, wherein the quantity of the channel layers is two, and the width of the first gate structure part is greater than the width of the second gate structure part, or the quantity of the channel layers is greater than or equal to three, the width of the first gate structure part is greater than the width of the second gate structure part, and widths of second gate structure parts increase gradually along a direction from a top of the gate structure to a bottom of the gate structure;
first spacers, located on sidewalls of the first gate structure part and sidewalls of the second gate structure part and covering surfaces of the channel layers exposed by the first gate structure part and the second gate structure part; and
a source-drain doping layer, penetrating through the channel structure layer on two sides of the gate structure.

15. The semiconductor structure according to claim 14, wherein the quantity of the channel layers is two, and along a direction perpendicular to the sidewalls of the gate structure, a thickness of a first spacer located on a sidewall of the first gate structure part is 3 nm to 6 nm, and a thickness of a first spacer located on a sidewall of the second gate structure part is 5 nm to 10 nm; or
the quantity of the channel layers is greater than or equal to three, and along a direction perpendicular to the sidewalls of the gate structure, the thickness of the first spacer located on the sidewall of the first gate structure part is 3 nm to 6 nm, and a thickness of a first spacer located on a sidewall of a second gate structure part closest to a top of the channel structure layer is 5 nm to 10 nm.

16. The semiconductor structure according to claim 14, wherein the quantity of the channel layers is greater than or equal to three, along the direction from the top of the gate structure to the bottom of the gate structure, adjacent first spacers have an equal thickness difference along the direction perpendicular to the sidewalls of the gate structure.

17. The semiconductor structure according to claim 14, wherein a material of the first spacer is silicon nitride, silicon oxynitride, silicon oxide, a low k dielectric material or a super-low k dielectric material.

18. The semiconductor structure according to claim 14, wherein the gate structure that covers a part of a top and a part of sidewalls of the channel structure layer is a third gate structure part, and the semiconductor structure further comprises: a second spacer, wherein the second spacer covers sidewalls of the third gate structure part, and sidewalls of the second spacer are flush with the sidewalls of the first spacers.

19. The semiconductor structure according to claim 14, wherein a material of the channel layer is Si or SiGe.

20. The semiconductor structure according to claim 14, wherein the semiconductor structure further comprises: an isolation layer, located between a bottom of the source-drain doping layer and the fin.

* * * * *